(12) United States Patent
Lee

(10) Patent No.: US 11,735,559 B2
(45) Date of Patent: Aug. 22, 2023

(54) SEMICONDUCTOR PACKAGES AND MANUFACTURING METHODS FOR THE SAME

(71) Applicant: SK hynix Inc., Icheon-si (KR)

(72) Inventor: Chan Sun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/871,616

(22) Filed: Jul. 22, 2022

(65) Prior Publication Data

US 2022/0359453 A1 Nov. 10, 2022

Related U.S. Application Data

(62) Division of application No. 16/900,238, filed on Jun. 12, 2020, now Pat. No. 11,437,342.

(30) Foreign Application Priority Data

Jan. 8, 2020 (KR) .......................... 10-2020-0002724

(51) Int. Cl.
*H01L 23/00* (2006.01)
*H01L 21/78* (2006.01)
*H01L 25/065* (2023.01)

(52) U.S. Cl.
CPC .............. *H01L 24/48* (2013.01); *H01L 21/78* (2013.01); *H01L 24/06* (2013.01); *H01L 24/73* (2013.01); *H01L 25/0657* (2013.01); *H01L 2224/0219* (2013.01); *H01L 2224/02185* (2013.01); *H01L 2224/04042* (2013.01); *H01L 2224/06132* (2013.01); *H01L 2224/06515* (2013.01); *H01L 2224/48227* (2013.01); *H01L 2224/48465* (2013.01); *H01L 2224/48992* (2013.01);
(Continued)

(58) Field of Classification Search
None
See application file for complete search history.

(56) References Cited

U.S. PATENT DOCUMENTS 9,431,364 B2 * 8/2016 Tan .......................... H01L 24/85
2002/0056924 A1 * 5/2002 Chung ................ H01L 23/3178
257/784
(Continued)

FOREIGN PATENT DOCUMENTS

KR 101182083 B1 9/2012

*Primary Examiner* — Nishath Yasmeen
(74) *Attorney, Agent, or Firm* — William Park & Associates Ltd.

(57) ABSTRACT

A semiconductor package and a fabrication method of the semiconductor package are disclosed. First and second redistribution layer patterns are formed on a semiconductor substrate including a chip region and a scribe lane region to provide a bonding pad portion and an edge pad portion, respectively. A polymer pattern is formed to reveal the bonding pad portion and a portion of the edge pad portion. A dicing line is set on the scribe lane region. A stealth dicing process is performed along the dicing line to separate a semiconductor chip including the bonding pad portion from the semiconductor substrate. The semiconductor chip is disposed on a package substrate. A bonding wire is formed to connect the bonding pad portion to the package substrate. The bonding wire is supported by an edge of the polymer pattern to be spaced apart from the revealed portion of the edge pad portion.

4 Claims, 14 Drawing Sheets

(52) U.S. Cl.
CPC ............ *H01L 2224/73265* (2013.01); *H01L 2225/0651* (2013.01); *H01L 2924/07025* (2013.01)

(56) References Cited

U.S. PATENT DOCUMENTS

| | | | | |
|---|---|---|---|---|
| 2005/0260842 | A1* | 11/2005 | Kaltalioglu | H01L 23/3171 |
| | | | | 257/E21.259 |
| 2007/0066044 | A1* | 3/2007 | Abe | B23K 26/40 |
| | | | | 257/E21.599 |
| 2014/0191417 | A1* | 7/2014 | Tan | H01L 25/0657 |
| | | | | 438/666 |
| 2015/0287684 | A1* | 10/2015 | Ishiguro | H01L 23/585 |
| | | | | 257/774 |
| 2018/0190621 | A1* | 7/2018 | Yan | H01L 25/0652 |
| 2018/0277456 | A1* | 9/2018 | Abe | H01L 25/0657 |
| 2019/0163061 | A1* | 5/2019 | Chen | C08G 73/1082 |

* cited by examiner

SEMICONDUCTOR PACKAGES AND MANUFACTURING METHODS FOR THE SAME

CROSS-REFERENCE TO RELATED APPLICATIONS

The present application is a divisional application of U.S. patent application Ser. No. 16/900,238, filed on Jun. 12, 2020, and claims priority under 35 U.S.C 119(a) to Korean Application No. 10-2020-0002724, filed on Jan. 8, 2020, which is incorporated herein by references in its entirety.

BACKGROUND

1. Technical Field

The present disclosure relates to semiconductor package technologies and, more particularly, to semiconductor packages and methods of manufacturing the same.

2. Related Art

Semiconductor packages may be configured to include at least one semiconductor chip, a package substrate, and bonding wires. The at least one semiconductor chip may be mounted on a package substrate and may be electrically connected to the package substrate through the bonding wires. A plurality of semiconductor chips may be fabricated on a semiconductor wafer, and the semiconductor wafer may be separated into a plurality of pieces to provide separate semiconductor chips. The semiconductor wafer may be separated into the plurality of semiconductor chips using a mechanical die sawing process with a diamond wheel or an optical die sawing process with laser.

SUMMARY

According to an embodiment, a method of fabricating a semiconductor package includes preparing a semiconductor substrate including a chip region in which first pads are disposed and a scribe lane region in which second pads are disposed. The scribe lane region surrounds the chip region. A dielectric layer is formed on the semiconductor substrate so as to reveal the first and second pads. First redistribution layer patterns connected to the first pads and second redistribution layer patterns connected to the second pads are formed on the dielectric layer. The first redistribution layer patterns extend to provide bonding pad portions and the second redistribution layer patterns extend to provide edge pad portions located on the scribe lane region. A polymer pattern is formed to cover the first and second redistribution layer patterns. The polymer pattern is formed to reveal the bonding pad portions and a boundary region including a portion of the dielectric layer on the scribe lane region and portions of the edge pad portions. A dicing line is set in the boundary region. The dicing line extends to surround the chip region. A stealth dicing process is performed along the dicing line to separate a semiconductor chip including the chip region and a portion of the boundary region from the semiconductor substrate. The semiconductor chip is disposed on a package substrate including bond fingers. Bonding wires, portions of which are supported by an edge of the polymer pattern, are formed to be spaced apart from the revealed portions of the edge pad portions. The bonding wires are formed to connect the bonding pad portions to the bond fingers.

According to another embodiment, a method of fabricating a semiconductor package includes preparing a semiconductor substrate including a chip region in which bonding pad portions are disposed and a scribe lane region in which edge pad portions are disposed. The scribe lane region surrounds the chip region. A polymer pattern is formed to reveal the bonding pad portions and a boundary region including a portion of the scribe lane region and portions of the edge pad portions. A dicing line is set in the boundary region. The dicing line extends to surround the chip region. A stealth dicing process is performed along the dicing line to separate a semiconductor chip including the chip region and a portion of the boundary region from the semiconductor substrate. The semiconductor chip is disposed on a package substrate including bond fingers. Bonding wires, portions of which are supported by an edge of the polymer pattern, are formed to be spaced apart from the revealed portions of the edge pad portions. The bonding wires are formed to connect the bonding pad portions to the bond fingers.

According to yet another embodiment, a semiconductor package includes a semiconductor chip including an edge pad portion and a bonding pad portion. An edge of edge pad portion is aligned with an edge of the semiconductor chip. The semiconductor chip is disposed on a package substrate including a bond finger. The bonding pad portion is connected to the bond finger through a bonding wire. The semiconductor chip includes a semiconductor substrate and a polymer pattern formed on the semiconductor substrate. The polymer pattern reveals edge portions of the semiconductor chip, a portion of the edge pad portion adjacent to an edge of the semiconductor chip, and the bonding pad portion. A portion of the bonding wire is supported by an edge of the polymer pattern such that the bonding wire is spaced apart from the edge pad portion.

DETAILED DESCRIPTION OF THE EMBODIMENTS

Figure 1:
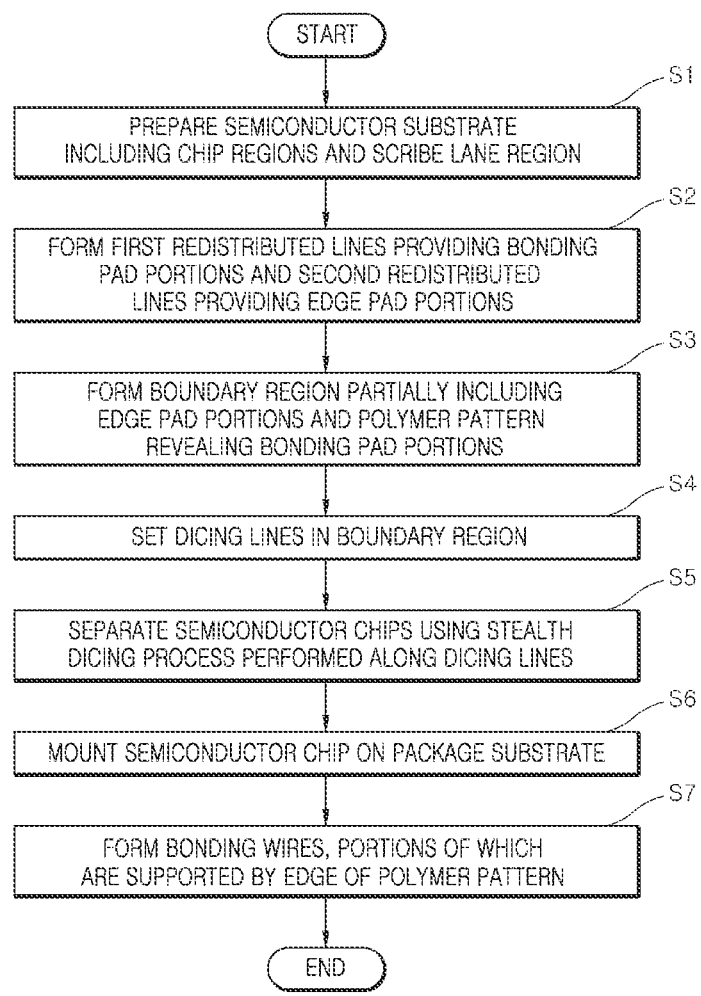
FIG. 1 is a process flowchart illustrating a method of fabricating a semiconductor package according to an embodiment.

The terms used herein may correspond to words selected in consideration of their functions in the embodiments, and the meanings of the terms may be construed to be different according to one of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various elements, these elements should not be limited by these terms. These terms are only used to distinguish one element from another element and are not used to indicate a particular sequence or number of elements.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

Semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, application specific integrated circuits (ASIC) chips, application processors (APs), graphic processing units (GPUs), central processing units (CPUs) or system-on-chips (SoCs). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems. The semiconductor packages may be applicable to Internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a process flowchart illustrating a method of fabricating a semiconductor package according to an embodiment.

Referring to FIG. 1, the method of fabricating a semiconductor package may include preparing a semiconductor substrate including chip regions and a scribe lane region (see a step S1). First redistribution layer patterns and second redistribution layer patterns may be formed on the semiconductor substrate to provide bonding pad portions and edge pad portions (see a step S2). The method of fabricating the semiconductor packages may further include forming a boundary region that partially includes the edge pad portions and a polymer pattern that reveals the bonding pad portions (see a step S3), setting dicing lines in the boundary region (see a step S4), and separating semiconductor chips by using a stealth dicing process performed along the dicing lines (see a step S5). At least one of the separated semiconductor chips may be mounted on a package substrate (see a step S6). Subsequently, bonding wires, portions of which are supported by an edge of the polymer pattern, may be formed to fabricate the semiconductor package (see a step S7).

Figure 2:
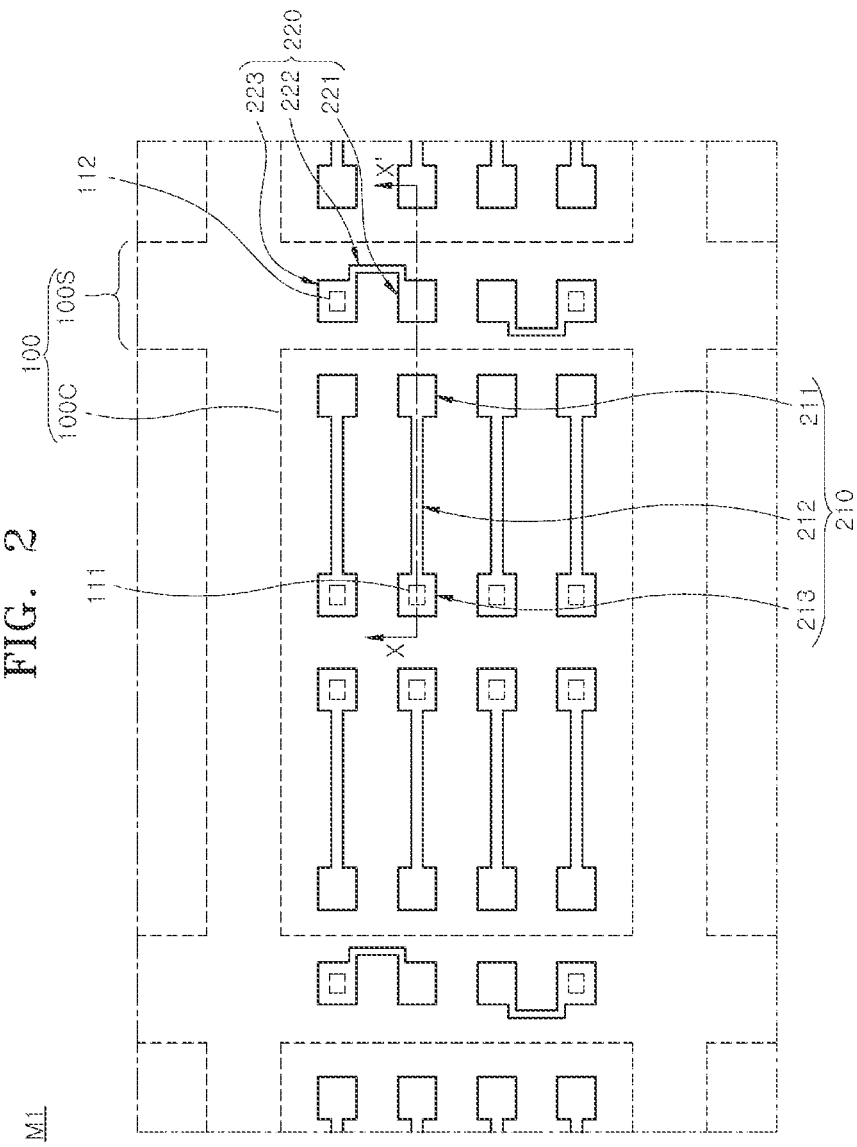
FIGS. 2 to 12 illustrate a method of fabricating a semiconductor package according to an embodiment.
Figure 3:
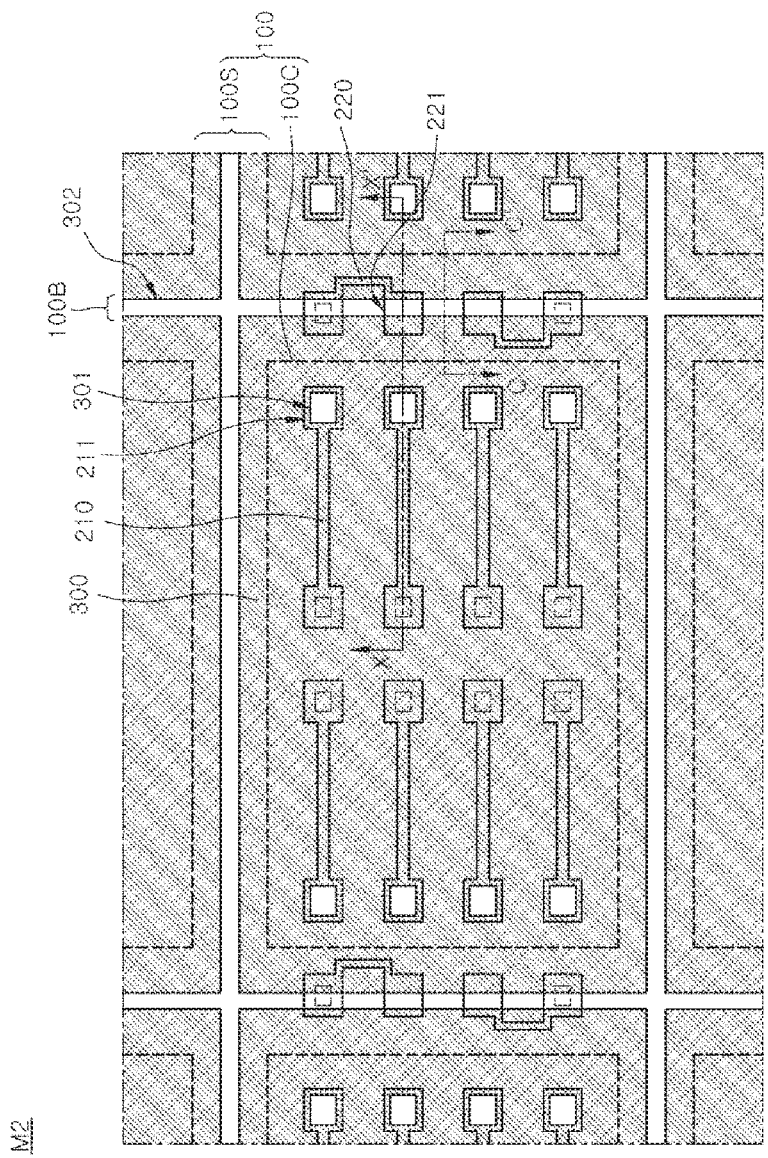
Figure 4:
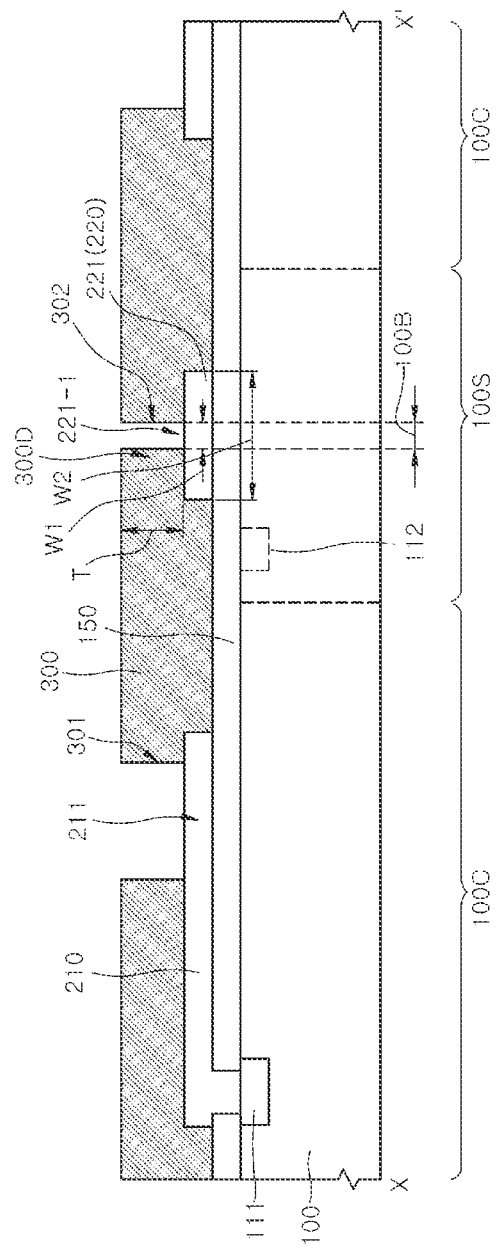
Figure 5:
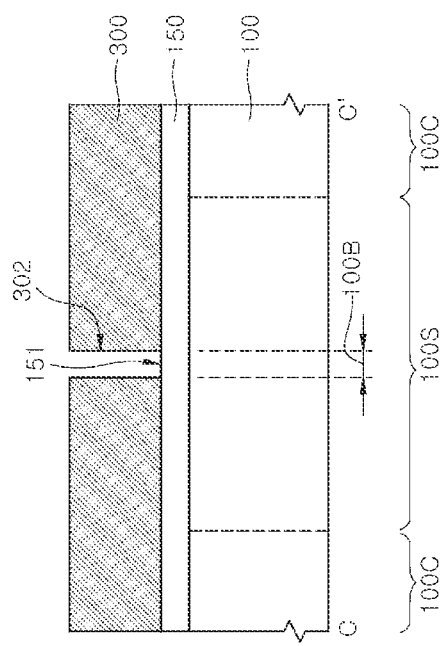

FIG. 2 is a plan view illustrating a layout M1 of first and second RDL (redistribution layer) patterns 210 and 220 formed on a semiconductor substrate 100. FIG. 3 is a plan view illustrating a layout M2 of polymer patterns 300 formed on the semiconductor substrate 100. FIGS. 4 and 5 are cross-sectional views, each of which illustrates the semiconductor substrate 100 and the polymer patterns 300. FIG. 4 is a cross-sectional view taken along a line X-X' of FIG. 3, and FIG. 5 is a cross-sectional view taken along a line C-C of FIG. 3.

Referring to FIGS. 1, 2, and 4, the semiconductor substrate 100 including chip regions 100C and a scribe lane region 100S may be provided (see step S1 of FIG. 1). The chip regions 100C may be disposed in the semiconductor substrate 100, and the scribe lane region 100S may be defined as a region between the chip regions 100C. The semiconductor substrate 100 may correspond to a semiconductor wafer.

Each of the chip regions 100C may be a region in which a semiconductor device, such as a memory device, is formed. The memory device may be a DRAM device or a flash memory device. Each of the chip regions 100C may have a tetragonal shape in a plan view. The chip regions 100C may be arrayed in a matrix form. The scribe lane region 100S may be defined as a region surrounding peripheries of the chip regions 100C. The scribe lane region 100S may have a lattice shape to define the chip regions 100C. The scribe lane region 100S may be set to have a width of approximately 60 micrometers. Various test patterns or monitoring patterns may be disposed in the scribe lane region 100S.

First pads 111 corresponding to conductive pads may be disposed in each of the chip regions 100C of the semiconductor substrate 100. Second pads 112 corresponding to conductive pads may be disposed in the scribe lane region 100S of the semiconductor substrate 100. The second pads 112 may be disposed to be spaced apart from the first pads 111. The first pads 111 may be connection terminals for electrically connecting integrated circuits of the chip region 100C to an external device. The first pads 111 may correspond to chip pads. The second pads 112 may be test terminals for measuring electrical characteristics of the test patterns or the monitoring patterns formed in the scribe lane region 100S.

The first and second RDL patterns 210 and 220 may be formed on the semiconductor substrate 100 (see step S2 of FIG. 1). Referring to FIG. 4, a dielectric layer 150 may be formed on the semiconductor substrate 100, and portions of the dielectric layer 150 may be removed by patterning the dielectric layer 150 to reveal the first patterns 111 and the second patterns 112. The dielectric layer 150 may be formed of a layer of a silicon-based insulation material. The dielectric layer 150 may be formed to include a silicon oxide layer, such as a tetra-ethyl-ortho-silicate (TEOS) layer. The dielectric layer 150 may be formed to have a thickness of approximately 4 micrometers to approximately 5 micrometers.

A conductive layer may be formed on the dielectric layer 150, and the conductive layer may be patterned to form the first and second RDL patterns 210 and 220. The first and second RDL patterns 210 and 220 may be formed of a metal layer containing an aluminum material or another conductive layer. The first and second RDL patterns 210 and 220 may be formed to have a similar thickness to the underlying dielectric layer 150. The first and second RDL patterns 210 and 220 may be formed to have a thickness of approximately 4 micrometers to approximately 5 micrometers.

Referring to FIG. 2, the first RDL patterns 210 may be formed of conductive patterns which are connected to the first pads 111 and which extend to provide bonding pad portions 211. Each of the first RDL patterns 210 may be a conductive pattern including an overlap portion 213 overlapping with any one of the first pads 111, the bonding pad portion 211 spaced apart from the overlap portion 213, and a connection portion 212 connecting the overlap portion 213 to the bonding pad portion 211. The bonding pad portions 211 may be located adjacent to the scribe lane region 100S in a horizontal direction in FIG. 2 such that a distance between the scribe lane region 100S and the bonding pad portions 211 is less than a distance between the scribe lane region 100S and the first pads 111.

The second RDL patterns 220 may be formed of conductive patterns which are connected to the second pads 112 and which extend to provide edge pad portions 221. Each of the second RDL patterns 220 may be a conductive pattern including an overlap portion 223 overlapping with any one of the second pads 112, the edge pad portion 221 spaced apart from the overlap portion 223, and a connection portion 222 connecting the overlap portion 223 to the edge pad portion 221. A distance between the bonding pad portions 211 and the edge pad portions 221 may be less than a distance between the first pads 111 and the edge pad portions 221. The edge pad portions 221 may correspond to test pads with which test probes of a test equipment are in contact, to apply electrical test signals to the second pads 112 connected to the edge pad portions 221.

Referring to FIGS. 1, 3, and 4, the polymer patterns 300 may be formed on the semiconductor substrate 100. The polymer patterns 300 may be formed of a passivation layer. The polymer patterns 300 may be formed to cover the chip regions 100C, respectively. Each of the polymer patterns 300 may be formed to have first windows 301 revealing the bonding pad portions 211. The polymer patterns 300 may be separated from each other by a second window 302 revealing a boundary region 100B.

The boundary region 100B opened by the second window 302 may correspond to a portion of the scribe lane region 100S. As illustrated in FIG. 5, the boundary region 100B may be a region including a portion 151 of the dielectric layer 150 located in the scribe lane region 100S. As illustrated in FIG. 4, the boundary region 100B may be a region including a portion 221-1 of each of the edge pad portions 221 located in the scribe lane region 100S.

The polymer patterns 300 may be formed to include a photosensitive polymer material. The polymer patterns 300 may be formed to include a photosensitive polyimide material such as a polyimide isoindoloquinazolinedione (PIQ) material. The polymer patterns 300 may be formed by forming a photosensitive polymer layer covering the dielectric layer 150 and the first and second RDL patterns 210 and 220 and by exposing and developing the photosensitive polymer layer to form the first and second widows 301 and 302.

Figure 6:
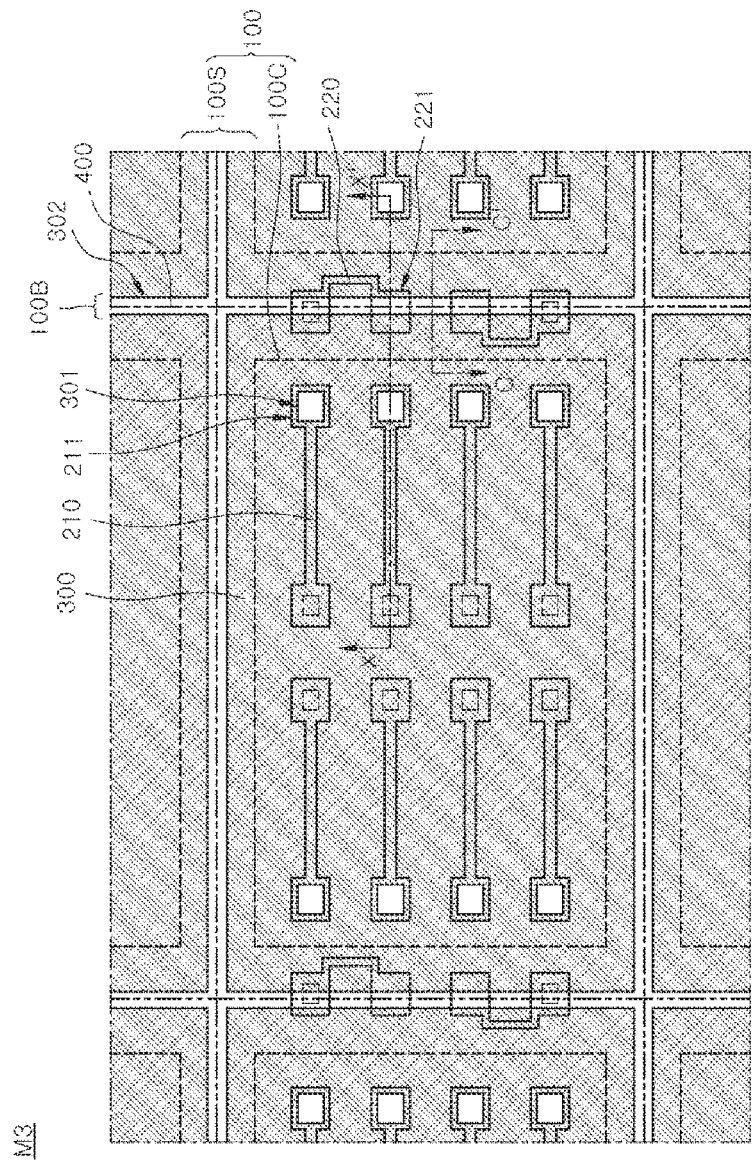
Figure 7:
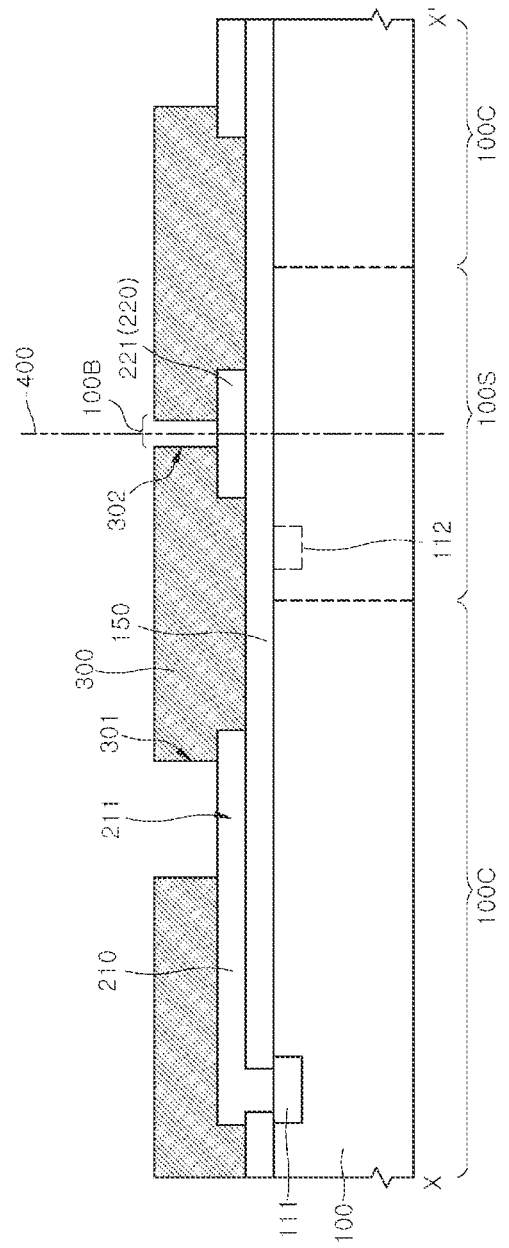

FIG. 6 is a plan view illustrating a layout M3 of a dicing line 400 which is set on the semiconductor substrate 100. FIG. 7 is a cross-sectional view taken along a line X-X' of FIG. 6.

Referring to FIGS. 1, 6, and 7, the dicing line 400 may be set to extend along the boundary region 100B (see step S4 of FIG. 1). The dicing line 400 may correspond to a reference line or a reference region along which the semiconductor substrate 100 is cut to separate the chip regions 100C in a subsequent dicing process. The dicing line 400 may be set in a portion of the boundary region 100B.

Figure 8:
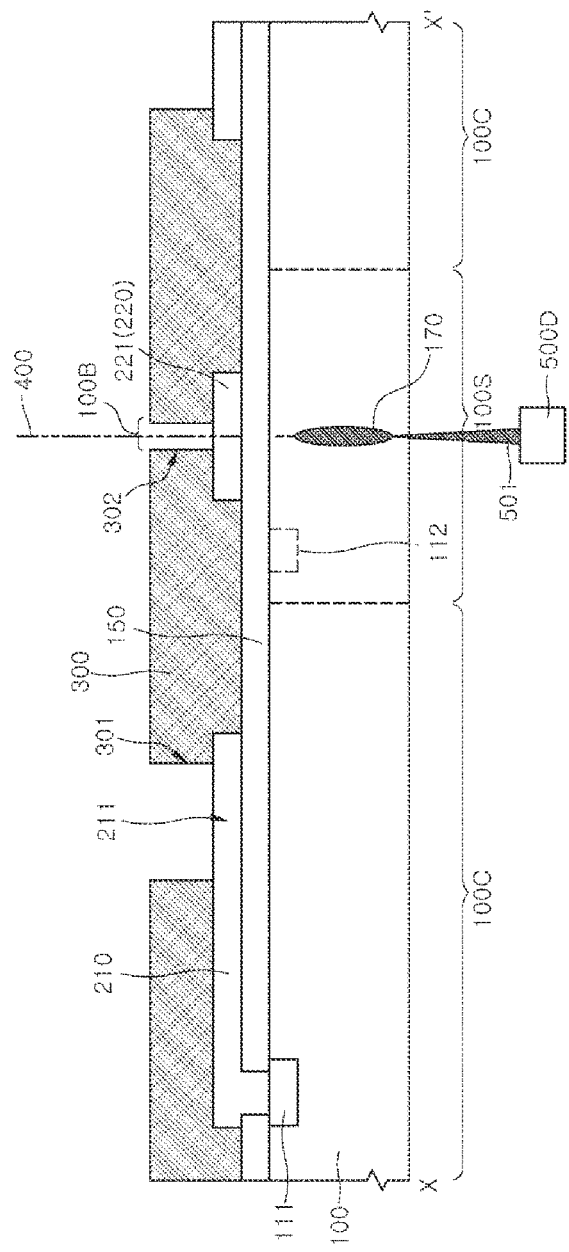
Figure 9:
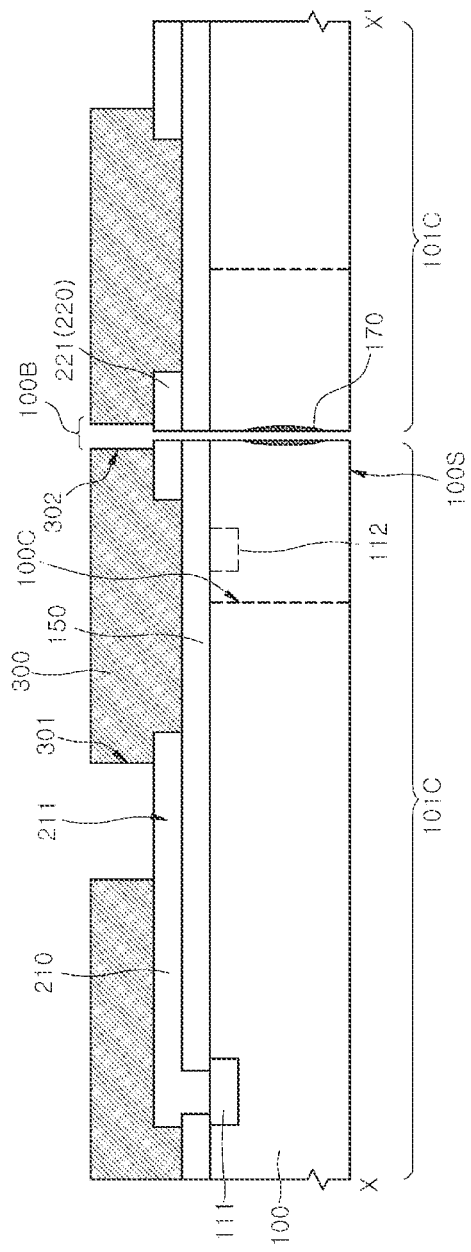
Figure 10:
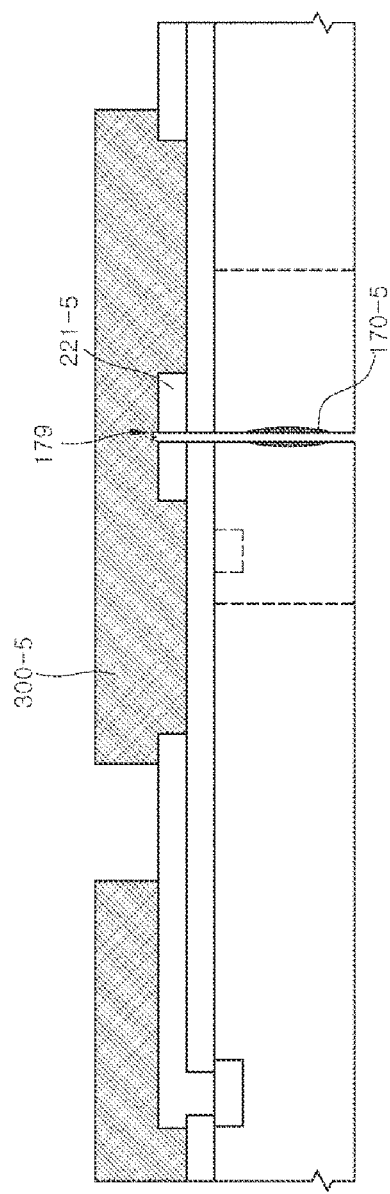

FIGS. 8 and 9 are cross-sectional views illustrating a process for separating semiconductor chips 101C from each other. FIG. 10 is a cross-sectional view illustrating a failure phenomenon occurring during the process for separating semiconductor chips 101C.

Referring to FIG. 8, defects 170 may be formed in the semiconductor substrate 100 using a stealth dicing process. Laser beam 501 for dicing the semiconductor substrate 100 may be directed into the semiconductor substrate 100 using a stealth dicing apparatus 500D. The laser beam 501 may generate the defects 170 in the semiconductor substrate 100. The laser beam 501 may be directed into the semiconductor substrate 100 while adjusting a focus of the laser beam 501 such that the defects 170 are generated to be spaced apart from each other along the dicing line 400. The defects 170 may cause damaged regions in the semiconductor substrate 100. For example, the laser beam 501 may change a crystalline structure of the semiconductor substrate 100 from a single crystalline structure into a polycrystalline structure or an amorphous structure to form the damaged regions including the crystalline defects 170.

Referring to FIG. 9, after the defects 170 are formed in the semiconductor substrate 100, a tensile force may be applied to the semiconductor substrate 100 by expanding the semiconductor substrate 100. As a result, cracks may be formed from the defects 170 by the tensile force applied to the semiconductor substrate 100, and the cracks may be propagated into the semiconductor substrate 100. Because the defects 170 are formed along the dicing line (400 of FIG. 7), the cracks may be propagated along the dicing line 400 and the semiconductor substrate 100 may be separated into the plurality of semiconductor chips 101C by the propagation of the cracks. This stealth dicing process may cut the semiconductor substrate 100 to provide the plurality of semiconductor chips 101C which are separated from each other. Each of the semiconductor chips 101C may be separated from the semiconductor substrate 100 to include any one of the chip regions 100C and a portion of the boundary region 1003 (see step S5 of FIG. 1).

As illustrated in FIG. 10, if a polymer pattern 300-5 is formed to cover an edge pad portion 221-5 and the dicing line, the polymer pattern 300-5 may disturb the propagation of the cracks from the defects 170-5. Because the polymer pattern 300-5 has a ductility, the polymer pattern 300-5 may disturb the propagation of the cracks to cause a dicing failure 179. That is, the cracks are not propagated into the polymer pattern 300-5 so that the polymer pattern 300-5 holds the semiconductor chips 101C. Accordingly, the semiconductor chips 101C covered with the polymer pattern 300-5 are not separated from each other to cause the dicing failure 179 even after the stealth dicing process.

As illustrated in FIGS. 6 and 8, because the dicing line 400 is a region extending along the boundary region 100B and the boundary region 100B is a region revealed by the second window 302 between the polymer patterns 300, no polymer pattern is on the dicing line 400. Because the dicing line 400 is not covered with the polymer patterns 300, it may prevent the dicing failure 179 from occurring when the semiconductor substrate 100 is cut by the stealth dicing process.

Figure 11:
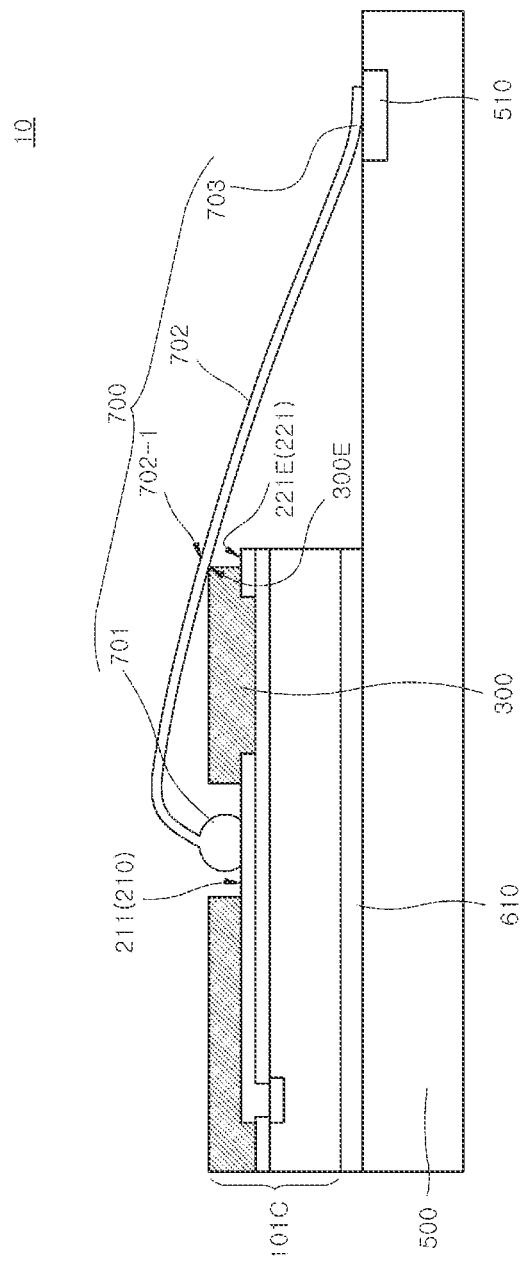

FIG. 11 is a cross-sectional view illustrating a process for mounting the semiconductor chip 101C on a package substrate 500.

Referring to FIG. 11, the semiconductor chip 101C may be disposed on the package substrate 500 (see step S6 of FIG. 1). The semiconductor chip 101C may be mounted on the package substrate 500 using an adhesive layer 610. The package substrate 500 may include conductive patterns acting as bond fingers 510 which are electrically connected to the semiconductor chip 101C. The package substrate 500 may be a printed circuit board (PCB) including interconnection members. Bonding wires 700 may be formed to electrically connect the bond fingers 510 of the package substrate 500 to the bonding pad portions 211 of the semiconductor chip 101C (see step S7 of FIG. 1).

Each of the bonding wires 700 may be formed to include a first end portion 701 contacting any one of the bonding pad portions 211, a second end portion 703 contacting any one of the bond fingers 510, and an extension portion 702 connecting the first end portion 701 to the second end portion 703. The bonding wires 700 may be formed using a wire bonding process to provide the semiconductor package 10.

Figure 12:
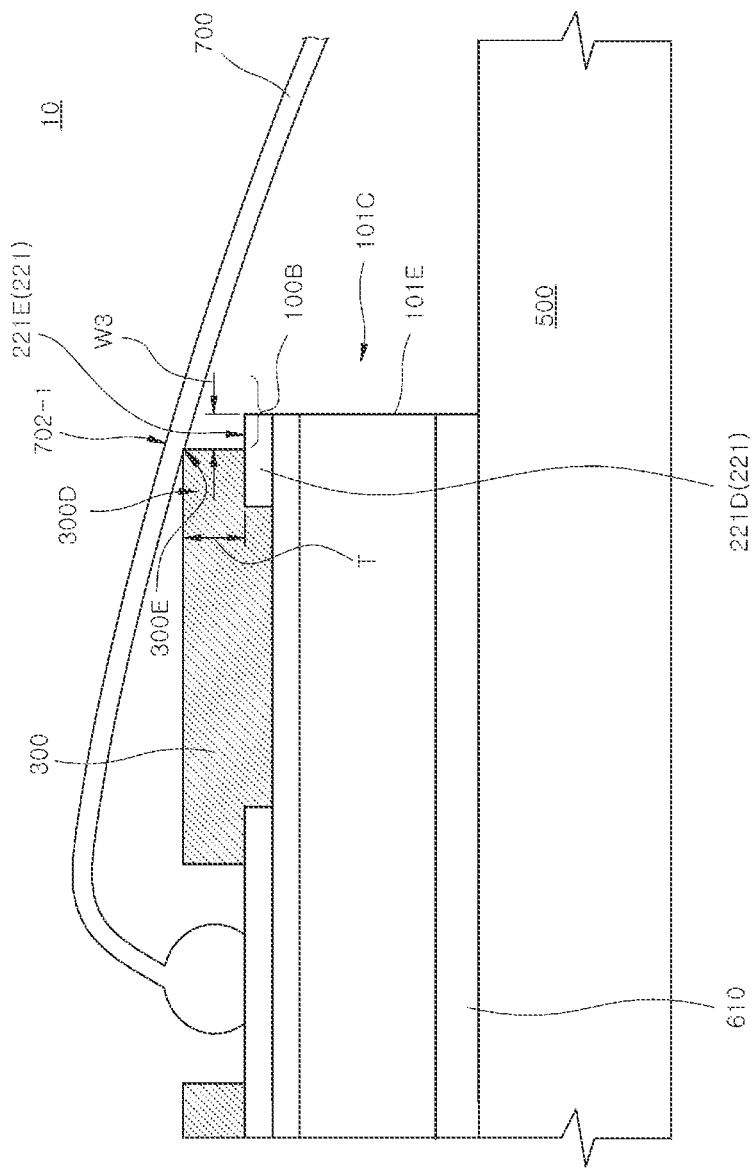

FIG. 12 is an enlarged view illustrating an edge portion 300E of the polymer pattern 300 shown in FIG. 11.

Referring to FIGS. 11 and 12, the bonding wires 700 may be formed such that a portion 702-1 of each of the bonding wires 700 is supported by the edge 300E of the polymer pattern 300. Because the portions 702-1 of the bonding wires 700 are supported by the edge 300E of the polymer pattern 300, the bonding wires 700 may extend to be spaced apart from remaining edge pad portions 221D.

The remaining edge pad portions 221D may correspond to remaining portions of the edge pad portions 221 after the edge pad portions 221 are cut by the stealth dicing process. Because the remaining edge pad portions 221D correspond to remaining portions of the edge pad portions 221 after the edge pad portions 221 are cut, edge portions of the remaining edge pad portions 221D may be vertically aligned with an edge 101E of the semiconductor chip 101C as illustrated in FIG. 12. Because portions 221E of the remaining edge pad portions 221D overlap with the boundary region 100B, the portions 221E of the remaining edge pad portions 221D may be exposed by the polymer pattern 300 even after the stealth dicing process.

The portions 221E of the remaining edge pad portions 221D may be exposed by the polymer pattern 300 to undesirably contact the bonding wires 700. However, according to the embodiment, the portions 702-1 of the bonding wires 700 may be supported by the edge portion 300E of the polymer pattern 300 such that the bonding wires 700 are spaced apart from the portions 221E of the remaining edge pad portions 221D. Thus, even though the portions 221E of the remaining edge pad portions 221D may be exposed by the polymer pattern 300, it may be possible to prevent the portions 221E of the remaining edge pad portions 221D from being in contact with the bonding wires 700.

In order to reliably guarantee electrical disconnection between the bonding wires 700 and the exposed portions 221E of the remaining edge pad portions 221D, a width W3 of the exposed portions 221E of the remaining edge pad portions 221D and a thickness T of an edge portion 300D of the polymer pattern 300 on the remaining edge pad portions 221D may be appropriately adjusted.

Referring again to FIGS. 4 and 12, before the semiconductor substrate 100 is cut by the stealth dicing process, a width (W1 of FIG. 4) of the portion 221-1 of the edge pad portion 221 exposed by the second window 302 between the polymer patterns 300 may be within the range of one fifth of a total width W2 of the edge pad portion 221 to half the total width W2 of the edge pad portion 221. After the semiconductor substrate 100 is cut by the stealth dicing process, the width (W3 of FIG. 12) of the exposed portion 221E of the remaining edge pad portion 221D may be equal to or less than a half of the width (W1 of FIG. 4) of the portion 221-1 of the edge pad portion 221 exposed by the second window 302 between the polymer patterns 300. Thus, the width (W3 of FIG. 12) of the exposed portion 221E of the remaining edge pad portion 221D may be adjusted by limiting the width (W1 of FIG. 4) of the portion 221-1 of the edge pad portion 221 exposed by the second window 302 between the polymer patterns 300.

The edge pad portion 221 of FIG. 4 may be formed of a conductive pattern having the width W2 of approximately 40 micrometers to approximately 50 micrometers, and the second window 302 between the polymer patterns 300 may be formed to have the width W1 of approximately 10 micrometers to approximately 20 micrometers. The portion 221-1 of the edge pad portion 221 may be exposed by the second window 302 to have the width W1 of approximately 10 micrometers to approximately 20 micrometers. After the semiconductor substrate 100 is cut by the stealth dicing process, the width (W3 of FIG. 12) of the exposed portion 221E of the remaining edge pad portion 221D may be approximately 5 micrometers to approximately 10 micrometers. As such, because the portion 221E of the remaining edge pad portion 221D is exposed to have the relatively narrow width W3, the bonding wires 700 of FIG. 12 may be sufficiently spaced apart from the exposed portion 221E of the remaining edge pad portion 221D.

As illustrated in FIG. 4, the thickness T of the edge portion 300D of the polymer pattern 300 on the edge pad portion 221 may be within the range of one fifth of the width W1 of the portion 221-1 of the edge pad portion 221 exposed by the second window 302 to half the width W1 of the portion 221-1 of the edge pad portion 221 exposed by the second window 302. When the portion 221-1 of the edge pad portion 221 exposed by the second window 302 has a width (corresponding to the width W1) of 10 micrometers to 20 micrometers, the thickness T of the edge portion 300D of the polymer pattern 300 on the edge pad portion 221 may be approximately 4 micrometers. The polymer pattern 300 directly disposed on the dielectric layer 150 may have a thickness of approximately 8.5 micrometers. As such, because the thickness T of the edge portion 300D of the polymer pattern 300 on the edge pad portion 221 is limited, the bonding wires 700 may be sufficiently spaced apart from the exposed portion 221E of the remaining edge pad portion 221D, as illustrated in FIG. 12.

Referring again to FIG. 4, a width of the boundary region 100B may be equal to a width (corresponding to the width W1) of the second window 302. The width of the boundary region 100B may be set to be within the range of approximately 10 micrometers to approximately 20 micrometers. A width of the scribe lane region 100S may be set to be within the range of three times a width (corresponding to the width W1) of the boundary region 100B to six times a width (corresponding to the width W1) of the boundary region 100B. When the width (corresponding to the width W1) of the boundary region 100B is less than the width W2 of the edge pad portion 221, the bonding wires (700 of FIG. 12) may be spaced apart from the exposed portion 221E of the remaining edge pad portion 221D.

Figure 13:
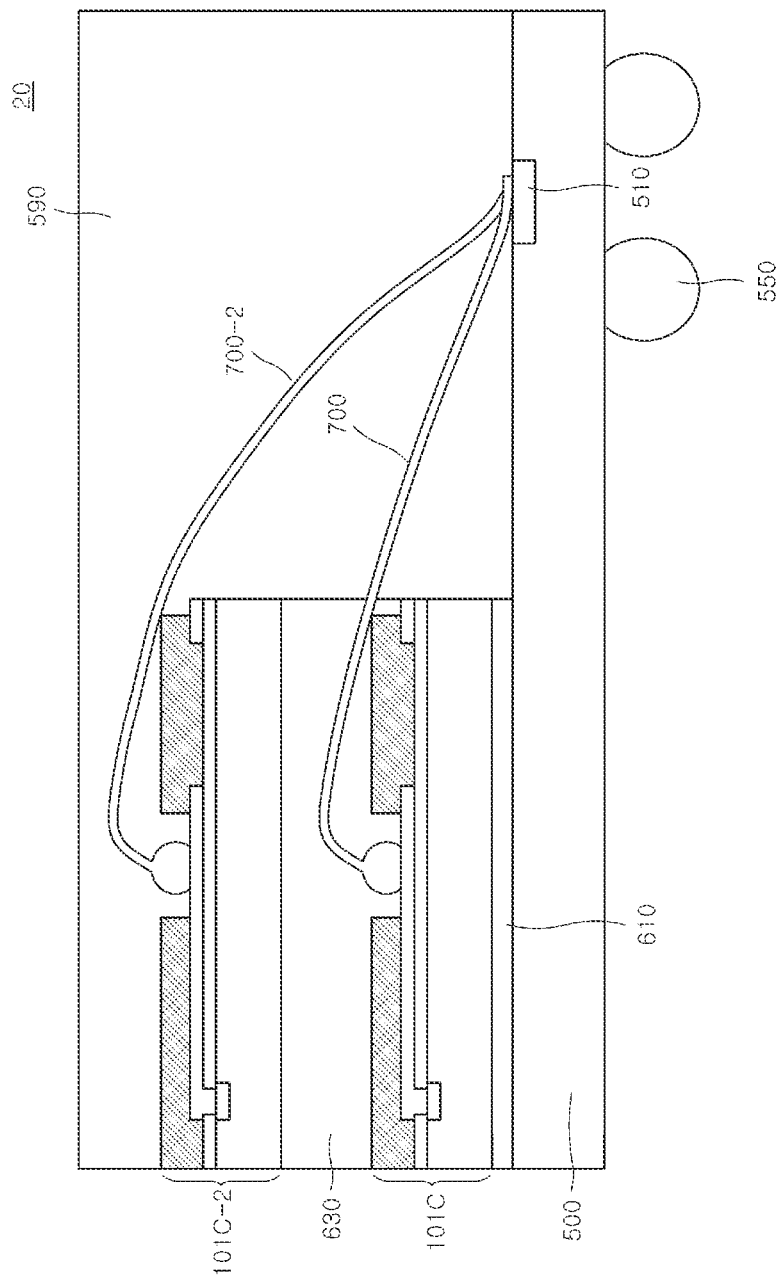
FIG. 13 is a cross-sectional view illustrating a semiconductor package according to an embodiment.

FIG. 13 is a cross-sectional view illustrating a semiconductor package 20 according to another embodiment.

Referring to FIG. 13, an upper semiconductor chip 101C-2 may be stacked on the semiconductor chip 101G. The upper semiconductor chip 101C-2 may be attached to the semiconductor chip 101C using an adhesive layer 630. In such a case, portions of the bonding wires 700 may be embedded in the adhesive layer 630. Upper bonding wires 700-2 may be additionally formed to electrically connect the upper semiconductor chip 101C-2 to the semiconductor chip 101C. An encapsulant 590 may be formed on the package substrate 500 to cover and protect the semiconductor chip 101C and the upper semiconductor chip 101C-2. The encapsulant 590 may be formed to include an encapsulant material such as an epoxy molding compound (EMC) material. Outer connectors 550 may be attached to the package substrate 500 to electrically connect the semiconductor package 20 to an external device or an external system. The outer connectors 550 may be formed of connection members such as solder balls.

Figure 14:
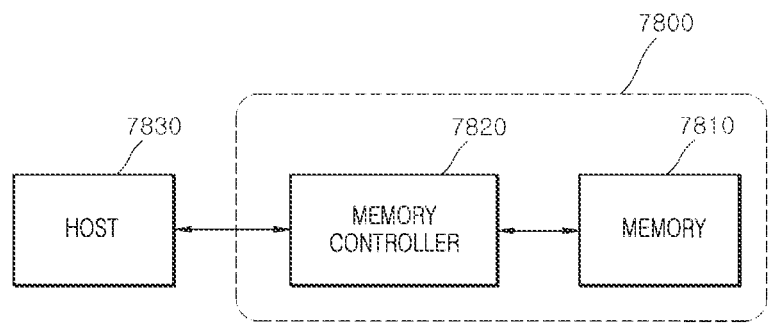
FIG. 14 is a block diagram illustrating an electronic system employing a memory card including a semiconductor package according to an embodiment.

FIG. 14 is a block diagram illustrating an electronic system including a memory card 7800 employing at least one semiconductor package according to an embodiment of the present disclosure. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 15:
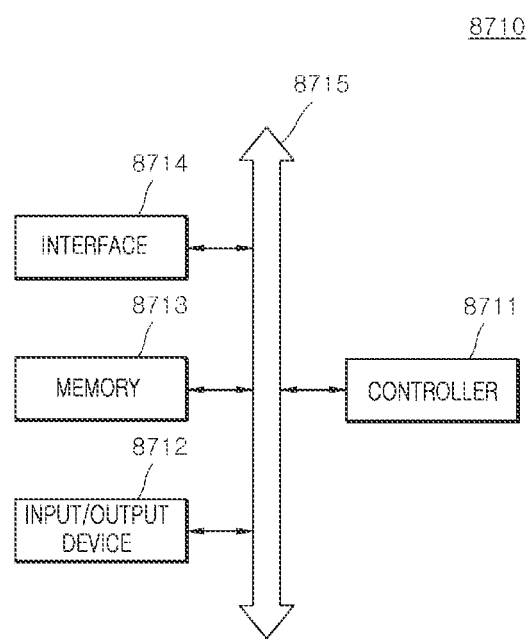
FIG. 15 is a block diagram illustrating another electronic system including a semiconductor package according to an embodiment.

FIG. 15 is a block diagram illustrating an electronic system 8710 including at least one semiconductor package according to an embodiment of the present disclosure. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor package comprising:
   a semiconductor chip including an edge pad portion and a bonding pad portion, wherein an edge of edge pad portion is aligned with an edge of the semiconductor chip;
   a package substrate on which the semiconductor chip is disposed, wherein the package substrate includes a bond finger; and
   a bonding wire connecting the bonding pad portion to the bond finger,
   wherein the semiconductor chip includes:
     a semiconductor substrate; and
     a polymer pattern formed on the semiconductor substrate to reveal edge portions of the semiconductor chip, a portion of the edge pad portion adjacent to an edge of the semiconductor chip, and the bonding pad portion, and
   wherein a portion of the bonding wire is physically supported by an edge of the polymer pattern such that the bonding wire is spaced apart from the edge pad portion, and
   wherein the edge of the polymer pattern is in direct contact with the revealed portions of the edge pad portions.

2. The semiconductor package of claim 1, wherein the semiconductor substrate includes:
   a first pad disposed in a chip region; and
   a second pad disposed in a scribe lane region,
   wherein the scribe lane region surrounds the chip region.

3. The semiconductor package of claim 2, wherein the semiconductor chip further includes:
   a dielectric layer formed on the semiconductor substrate so as to reveal the first and second pads;
   a first redistribution layer pattern formed on the dielectric layer to be connected to the first pad and to provide the bonding pad portion; and
   a second redistribution layer pattern formed on the dielectric layer to be connected to the second pad and to provide the edge pad portion.

4. The semiconductor package of claim 1, wherein the polymer pattern includes a photosensitive polyimide material.

\* \* \* \* \*